United States Patent
Kaminishi

(10) Patent No.: US 10,236,856 B2
(45) Date of Patent: Mar. 19, 2019

(54) DIPLEXER

(71) Applicant: Murata Manufacturing Co., Ltd., Nagaokakyo-shi, Kyoto-fu (JP)

(72) Inventor: Yuji Kaminishi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/708,195

(22) Filed: Sep. 19, 2017

(65) Prior Publication Data

US 2018/0006625 A1    Jan. 4, 2018

Related U.S. Application Data

(63) Continuation of application No. PCT/JP2016/051106, filed on Jan. 15, 2016.

(30) Foreign Application Priority Data

Mar. 25, 2015 (JP) ................. 2015-062653
Jun. 22, 2015 (JP) ................. 2015-124398

(51) Int. Cl.
*H03H 7/01* (2006.01)
*H03H 7/03* (2006.01)
*H03H 7/09* (2006.01)
*H03H 7/46* (2006.01)

(52) U.S. Cl.
CPC ............ *H03H 7/03* (2013.01); *H03H 7/0115* (2013.01); *H03H 7/46* (2013.01); *H03H 7/463* (2013.01); *H03H 7/09* (2013.01)

(58) Field of Classification Search
CPC .......... H03H 7/03; H03H 7/0115; H03H 7/46; H03H 7/463; H03H 7/09
See application file for complete search history.

(56) References Cited

U.S. PATENT DOCUMENTS

| 9,030,273 B2 | 5/2015 | Masuda |
| 2010/0073108 A1 | 3/2010 | Yamasita et al. |
| 2010/0283557 A1 | 11/2010 | Taniguchi |

FOREIGN PATENT DOCUMENTS

| CN | 103066347 A | 4/2013 |
| EP | 2 009 787 A1 | 12/2008 |
| WO | 2007/119356 A1 | 10/2007 |
| WO | 2008/066198 A1 | 6/2008 |
| WO | 2009/142113 A1 | 11/2009 |
| WO | 2012/066946 A1 | 5/2012 |

OTHER PUBLICATIONS

Official Communication issued in International Patent Application No. PCT/JP2016/051106, dated Mar. 15, 2016.

*Primary Examiner* — Robert J Pascal
*Assistant Examiner* — Kimberly E Glenn
(74) *Attorney, Agent, or Firm* — Keating & Bennett, LLP

(57) ABSTRACT

A diplexer includes a first filter circuit including a first loop inductor defining a first loop plane and a second loop inductor defining a second loop plane, a second filter circuit adjacent to the first filter circuit, and a first via hole conductor that electrically connects an input/output terminal, the first filter circuit and the second filter circuit to each other. The first loop plane faces the second loop plane while protruding beyond the second loop plane in a first direction. The first via hole conductor is provided relative to the first loop inductor in a second direction from the first loop plane toward the second loop plane, and is superposed with a portion of the first loop plane that protrudes beyond the second loop plane when viewed in the second direction.

18 Claims, 13 Drawing Sheets

DIPLEXER

CROSS REFERENCE TO RELATED APPLICATIONS

This application claims the benefit of priority to Japanese Patent Application No. 2015-062653 filed on Mar. 25, 2015 and Japanese Patent Application No. 2015-124398 filed on Jun. 22, 2015 and is a Continuation Application of PCT Application No. PCT/JP2016/051106 filed on Jan. 15, 2016. The entire contents of each application are hereby incorporated herein by reference.

BACKGROUND OF THE INVENTION

1. Field of the Invention

The present invention relates to a diplexer.

2. Description of the Related Art

For example, as an invention that is related to a diplexer of the prior art, the multilayer band pass filter disclosed in International Publication No. 2007/119356 is known. The multilayer band pass filter includes a plurality of LC parallel resonators. Each LC parallel resonator includes an inductor electrode that extends in a lateral direction of a multilayer body, a first via hole conductor that extends in a stacking direction from a front end of the inductor electrode, and a second via hole conductor that extends in the stacking direction from a rear end of the inductor electrode. With this configuration, loop planes are formed and surrounded by the inductor electrodes, the first via hole conductors and the second via hole conductors. The plurality of LC parallel resonators are arranged side by side in a single row in a longitudinal direction of the multilayer body such that the adjacent loop planes face each other. In this multilayer band pass filter, via hole conductors having a large cross-sectional area and a small resistance value are used, and therefore the insertion loss is small.

The structure of the multilayer band pass filter disclosed in International Publication No. 2007/119356 may be applied to a high-band-side filter (HB-side filter) of a diplexer. In such a case, there is a demand to make the surface area of a mounting region that is required to mount the diplexer small. Accordingly, outer electrodes are formed on only the bottom surface of the multilayer body in the diplexer. Thus, outer electrodes are not formed on the side surfaces of the multilayer body, and solder fillets are not formed on the side surfaces of the multilayer body when mounting the diplexer. As a result, the surface area of the mounting region required to mount the diplexer becomes smaller.

However, when the outer electrodes are formed on only the bottom surface of the multilayer body, routing of wiring lines inside the diplexer becomes complex as described below. FIG. 12 is a drawing in which a diplexer 100 in which an outer electrode 108 is formed so as to extend onto a top surface, a bottom surface and a side surface of a multilayer body 102 is viewed in a transparent manner from above. FIG. 13 is a drawing in which a diplexer 200 in which an outer electrode 208 is formed on only a bottom surface of a multilayer body 202 is viewed in a transparent manner from above.

In more detail, as illustrated in FIGS. 12 and 13, the diplexers 100 and 200 respectively have HB-side filters 104 and 204 and low-band-side filters (LB-side filters) 106 and 206 built thereinto in order to separate high-frequency signals and low-frequency signals from each other. As illustrated in FIG. 12, in the case where the outer electrode 108 is formed on a side surface of the multilayer body 102, a part of the LB-side filter 106 close to the top surface, and the outer electrode 108 can be connected to each other by an extension conductor layer 112.

In contrast, as illustrated in FIG. 13, when the outer electrode 208 is formed on only the bottom surface of the multilayer body 202, a via hole conductor that extends from part of the LB-side filter 206 that is close to the top surface to the bottom surface has to be used in order to connect the part of the LB-side filter 206 close to the top surface and the outer electrode 208 to each other. However, when an attempt is made to connect the part of the LB-side filter 206 close to the top surface and the outer electrode 208 to each other using one via hole conductor in the case where the outer electrode 208 overlaps the HB-side filter 204 and the LB-side filter 206 in plan view as in FIG. 13, there is interference between the HB-side filter 204 and the LB-side filter 206, and the via hole conductor. Therefore, it is necessary to connect the LB-side filter 206 and the outer electrode 208 to each other by routing via hole conductors and conductor layers and routing conductors of the HB-side filter 204 or the LB-side filter 206 so as to avoid the HB-side filter 204 and the LB-side filter 206. As a result, routing of via hole conductors and conductor layers inside the diplexer 200 becomes complex, and insertion loss is increased due to the extra wiring lines, and this causes degradation of characteristics.

SUMMARY OF THE INVENTION

Accordingly, preferred embodiments of the present invention provide diplexers in which the routing of conductors is not complex.

A diplexer according to a preferred embodiment of the present invention includes a multilayer body that includes a plurality of insulator layers stacked on top of one another in a stacking direction, the multilayer body including a bottom surface that is positioned at one end in the stacking direction; an input/output terminal that is provided on the bottom surface; a first filter circuit that includes a first loop inductor and a second loop inductor; a second filter circuit that is adjacent to the first filter circuit when viewed in the stacking direction; and a first via hole conductor that electrically connects the input/output terminal, the first filter circuit and the second filter circuit to each other. The first loop inductor includes a line-shaped first inductor conductor that extends in a first direction from the first filter circuit toward the second filter circuit when viewed in the stacking direction, and a second via hole conductor and a third via hole conductor that extend from the first inductor conductor toward the bottom surface, and defines a first loop plane. The second loop inductor includes a line-shaped second inductor conductor that extends in the first direction when viewed in the stacking direction, and a fourth via hole conductor and a fifth via hole conductor that extend from the second inductor conductor toward the bottom surface, and defines a second loop plane. The first loop plane faces the second loop plane while protruding beyond the second loop plane in the first direction. The first via hole conductor is provided in a second direction, which extends from the first loop plane toward the second loop plane, relative to the first loop inductor, and the first via hole conductor is superposed with a portion of the first loop plane that protrudes beyond the second loop plane when viewed in the second direction.

According to preferred embodiments of the present invention, routing of conductors is prevented from becoming complex.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
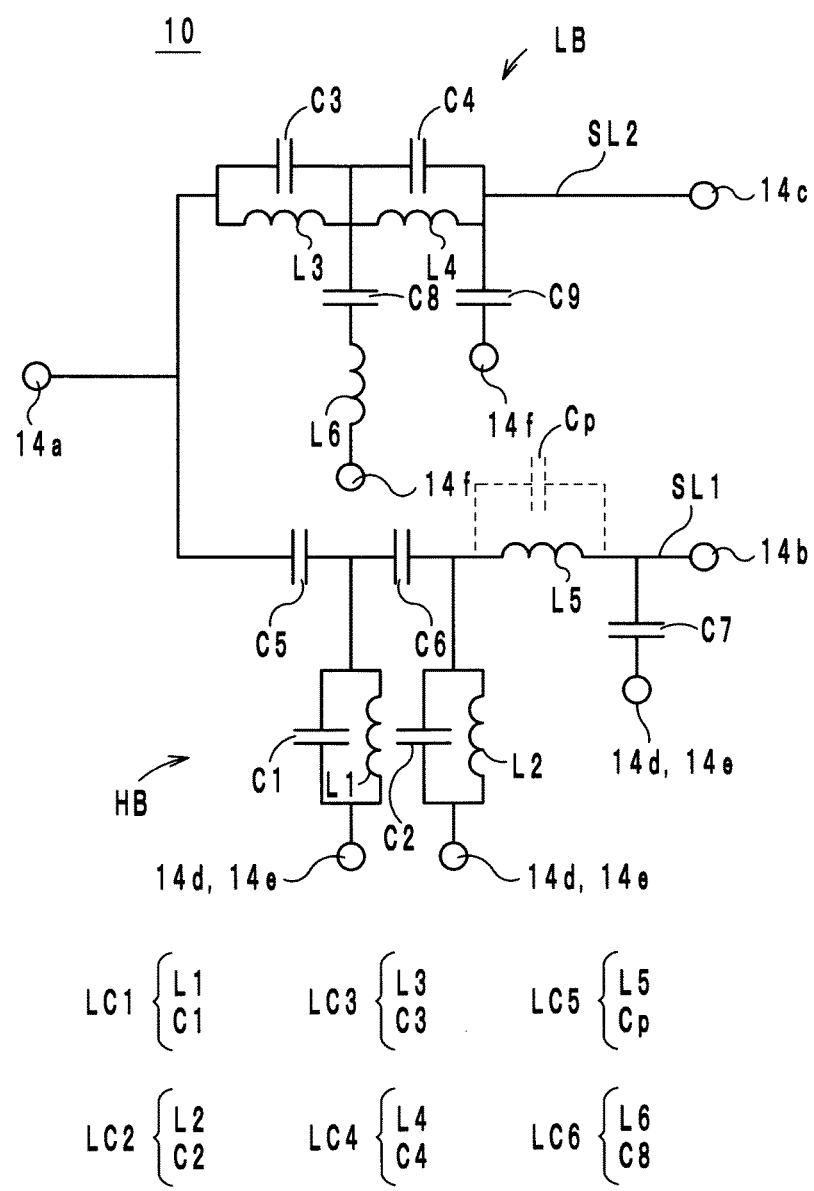
FIG. 1 is an equivalent circuit diagram of a diplexer 10 according to a preferred embodiment of the present invention.

A circuit configuration of a diplexer 10 according to a preferred embodiment of the present invention will be described while referring to the drawings. FIG. 1 is an equivalent circuit diagram of the diplexer 10 according to the present preferred embodiment.

As illustrated in FIG. 1, the diplexer 10 includes signal lines SL1 and SL2, outer electrodes 14a to 14f, inductors L1 to L6 and capacitors C1 to C9.

The outer electrodes 14a to 14c are high-frequency signal input/output terminals. The outer electrodes 14d to 14f are ground terminals that are connected to the ground potential. One end of the signal line SL1 is connected to the outer electrode 14a. The other end of the signal line SL1 is connected to the outer electrode 14b. One end of the signal line SL2 is connected to the outer electrode 14a. The other end of the signal line SL2 is connected to the outer electrode 14c. That is, the diplexer 10 has a structure in which the signal line SL1 and the signal line SL2 branch from each other.

The capacitors C5 and C6 and the inductor L5 are provided along the signal line SL1 and are connected in series with each other in this order in a direction from the outer electrode 14a to the outer electrode 14b. In addition, a capacitor Cp is a stray capacitance generated by the inductor L5 and is connected in parallel with the inductor L5. Thus, the inductor L5 and the capacitor Cp define an LC parallel resonator LC5 (example of LC resonator).

The capacitor C1 (example of first capacitor) and the inductor L1 (example of first loop inductor) are connected in parallel with each other and thus define an LC parallel resonator LC1. One end of the LC parallel resonator LC1 is connected to the signal line SL1 between the capacitor C5 and the capacitor C6. The other end of the LC parallel resonator LC1 is connected to the outer electrodes 14d and 14e.

The capacitor C2 (example of second capacitor) and the inductor L2 (example of second loop inductor) are connected in parallel with each other and thus define an LC parallel resonator LC2. One end of the LC parallel resonator LC2 is connected to the signal line SL1 between the capacitor C6 and the inductor L5. The other end of the LC parallel resonator LC2 is connected to the outer electrodes 14d and 14e. In addition, the inductor L1 and the inductor L2 are electromagnetically coupled with each other.

One electrode of the capacitor C7 is connected to the signal line SL1 between the inductor L5 and the outer electrode 14b. The other electrode of the capacitor C7 is connected to the outer electrodes 14d and 14e.

The thus-configured LC parallel resonators LC1, LC2 and LC5 and capacitors C5 and C6 define a HB-side filter HB (example of first filter circuit) having a first frequency band with a center frequency of 5 GHz, for example. In other words, the HB-side filter HB allows a high-frequency signal having the first frequency band to pass between the outer electrode 14a and the outer electrode 14b.

In more detail, the capacitors C5 to C7 perform impedance matching for the LC parallel resonators LC1 and LC2 and convert an impedance to a prescribed impedance (for example, 50 Ω). The LC parallel resonator LC5 acts to obstruct passage of the resonant frequency thereof. As a result, among high-frequency signals input from the outer electrode 14a, high-frequency signals having frequencies equal to the resonant frequencies of the LC parallel resonators LC1 and LC2 are output to the outer electrode 14b, and a high-frequency signal having a frequency equal to the resonant frequency of the LC parallel resonator LC5 is not output to the outer electrode 14b.

The capacitor C3 and the inductor L3 are connected in parallel with each other and thus define an LC parallel resonator LC3. The capacitor C4 and the inductor L4 are connected in parallel with each other and thus define an LC parallel resonator LC4. The parallel resonators LC3 and LC4 are provided along the signal line SL2, and are connected in series with each other in this order in a direction from the outer electrode 14a to the outer electrode 14c. One end of the LC parallel resonator LC3 is connected to the outer electrode 14a. The other end of the LC parallel resonator LC3 and one end of the LC parallel resonator LC4 are connected to each other. The other end of the LC parallel resonator LC4 is connected to the outer electrode 14c.

The capacitor C8 and the inductor L6 are connected in series with each other and thus define an LC series resonator LC6. One end of the LC series resonator LC6 is connected to the signal line SL2 between the LC parallel resonator LC3 and the LC parallel resonator LC4. The other end of the LC series resonator LC6 is connected to the outer electrode 14f.

One electrode of the capacitor C9 is connected between the LC parallel resonator LC4 and the outer electrode 14c. The other electrode of the capacitor C9 is connected to the outer electrode 14f.

The LC parallel resonators LC3 and LC4, LC series resonator LC6 and capacitor C9 define an LB-side filter LB (example of second filter circuit) having a second frequency band with a center frequency of 2 GHz (that is, a center frequency that is lower than the center frequency of the first frequency band), for example. In other words, the LB-side filter LB allows a high-frequency signal having the second frequency band to pass between the outer electrode 14a and the outer electrode 14c.

In more detail, a two-stage low pass filter is defined by the inductor L3 and the capacitor C8 and the inductor L4 and the capacitor C9, and a high-frequency signal having a frequency that is higher than a cutoff frequency obtained using the inductors L3 and L4 and the capacitors C8 and C9 is not allowed to pass between the outer electrode 14a and the outer electrode 14c. Similarly, the LC parallel resonators LC3 and LC4 do not allow high-frequency signals having frequencies equal to the resonant frequencies thereof to pass between the outer electrode 14a and the outer electrode 14c. The resonant frequencies of the LC parallel resonators LC3 and LC4 are frequencies in the vicinity of the high-frequency side of the second frequency band, for example. The LC series resonator LC6 does not allow a high-frequency signal having a frequency equal to the resonant frequency of the LC series resonator LC6 to pass between the outer electrode 14a and the outer electrode 14c.

The diplexer 10 defines and functions as a diplexer as described above. For example, a high-frequency signal of the first frequency band (around 5 GHz, for example) among high-frequency signals input from the outer electrode 14a is output from the outer electrode 14b. A high-frequency signal of the second frequency band (around 2 GHz, for example) among the high-frequency signals input from the outer electrode 14a is output from the outer electrode 14c.

Figure 2A:
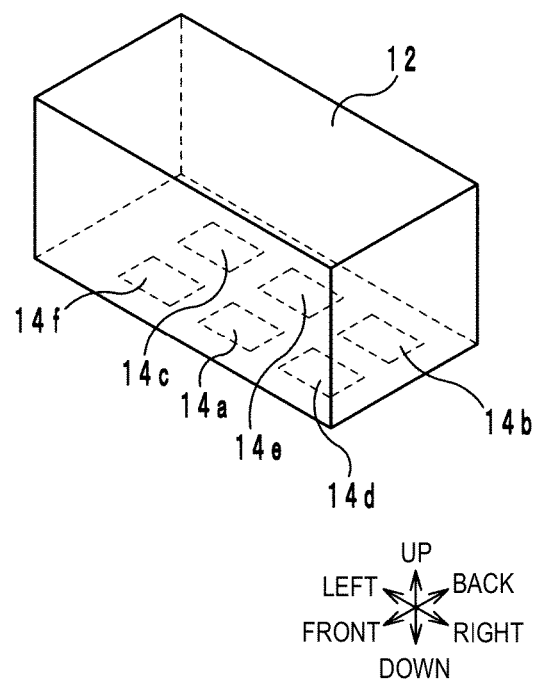
FIG. 2A is an external perspective view of the diplexer 10.
Figure 2B:
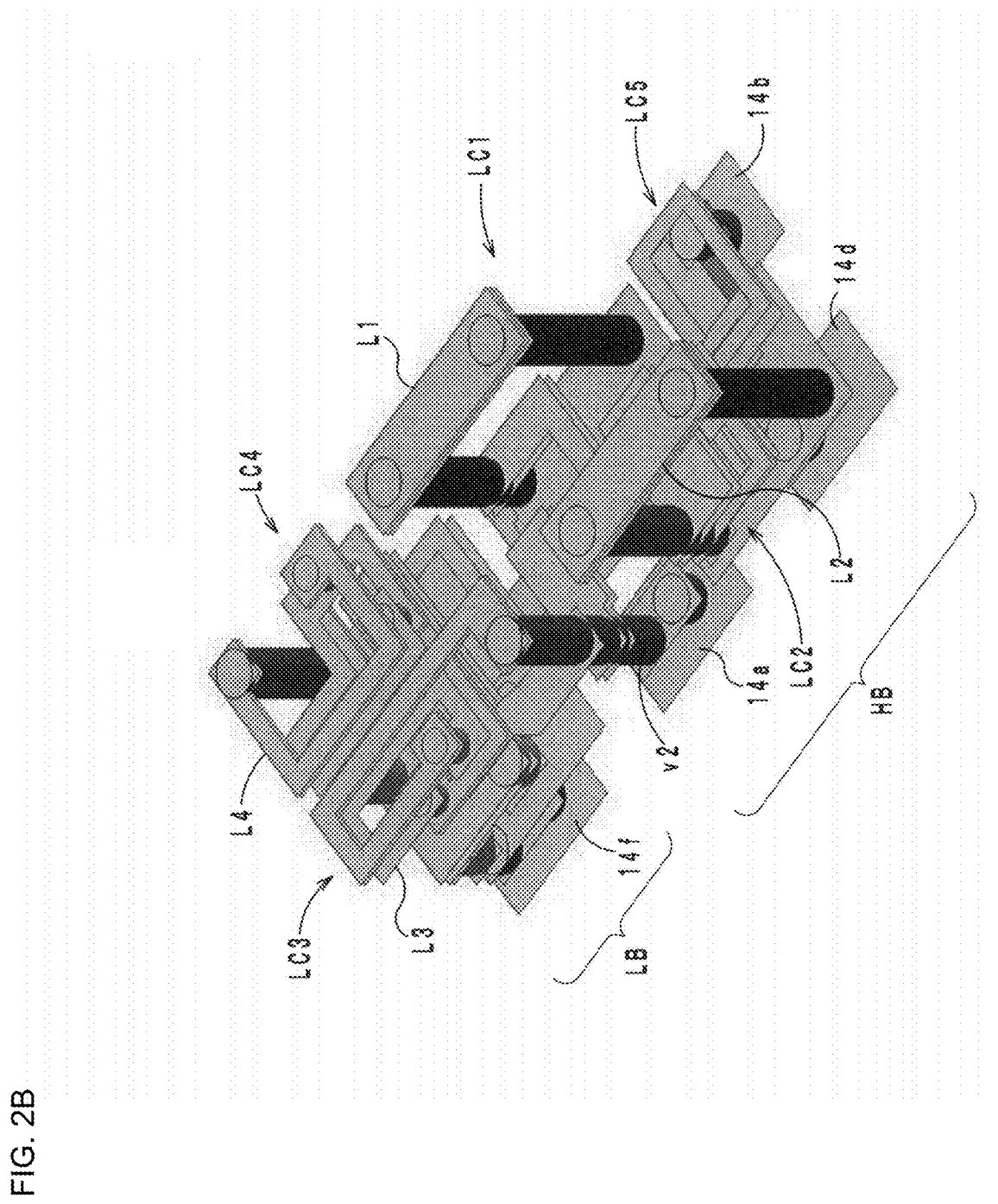
FIG. 2B is a transparent view of the diplexer 10.
Figure 3:
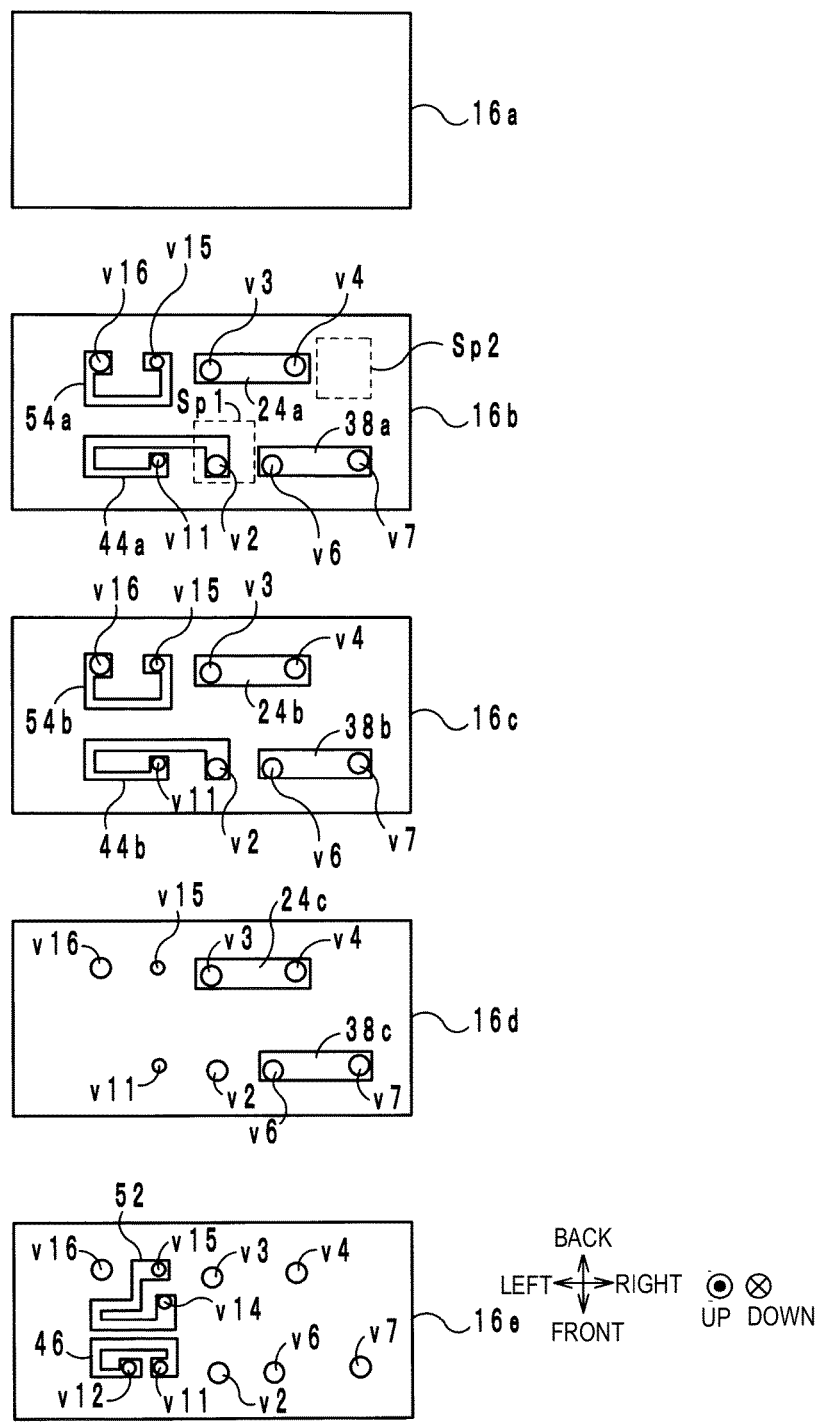
FIG. 3 is an exploded view of the diplexer 10.
Figure 4:
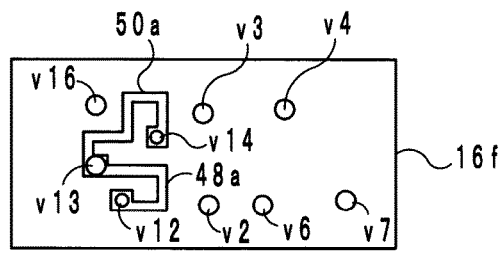
FIG. 4 is an exploded view of the diplexer 10.
Figure 4:
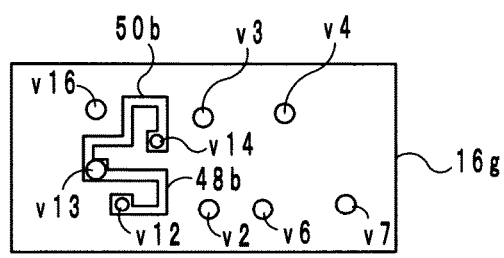
Figure 4:
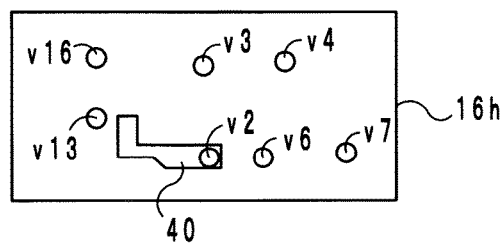
Figure 4:
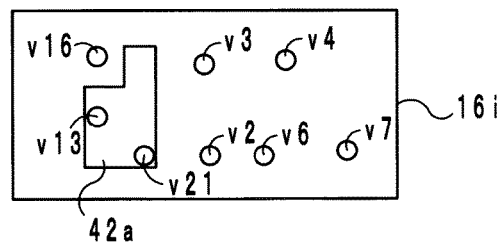
Figure 5:
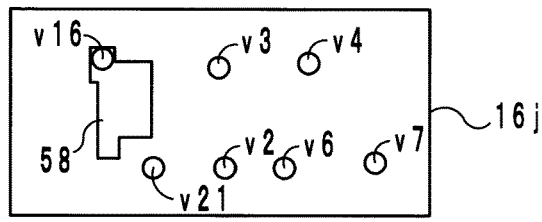
FIG. 5 is an exploded view of the diplexer 10.
Figure 5:
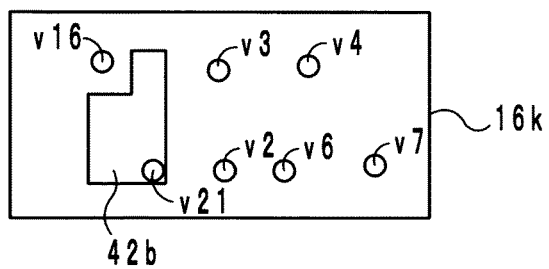
Figure 5:
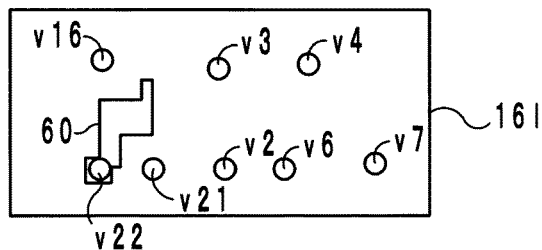
Figure 5:
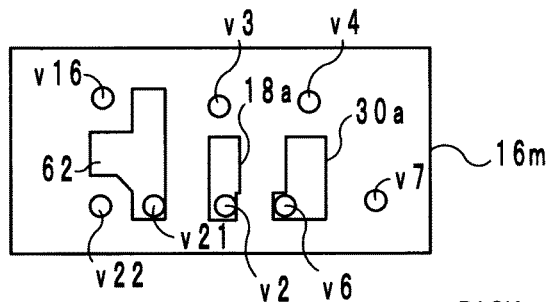
Figure 6:
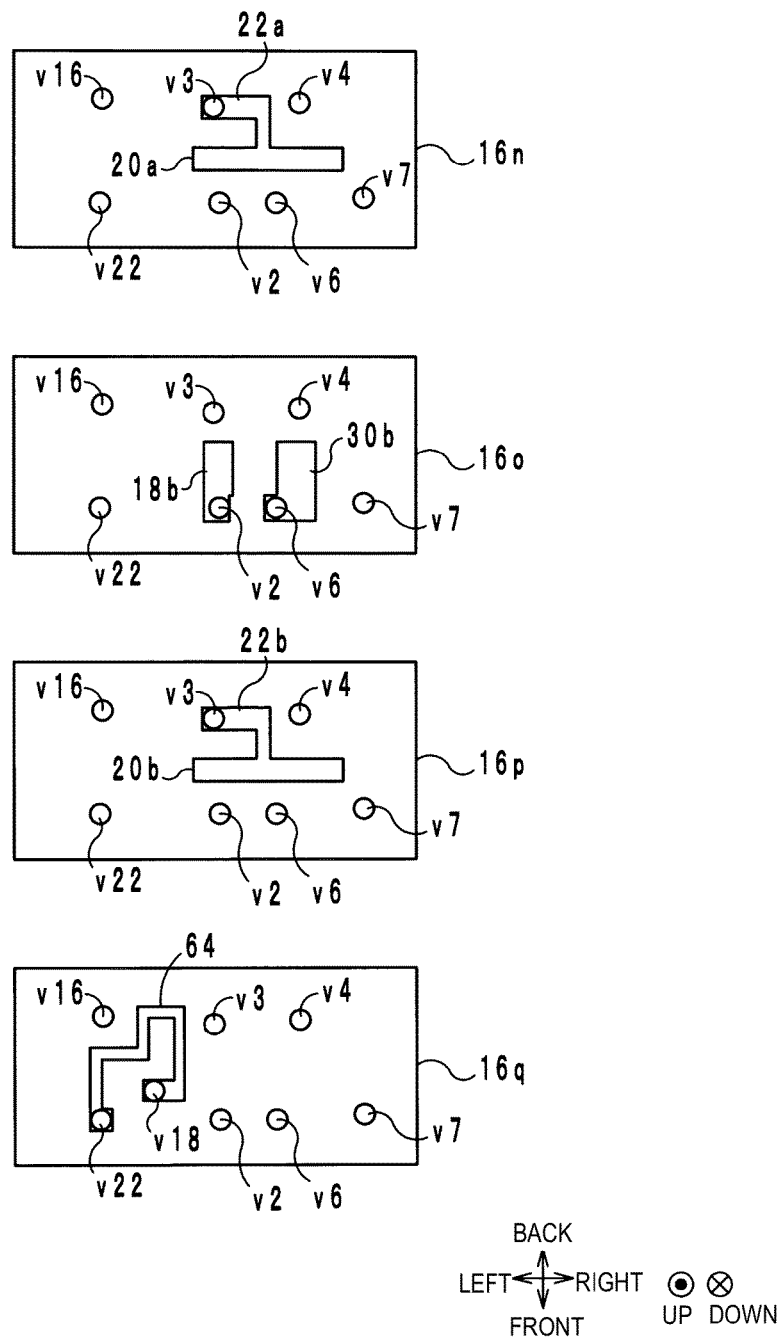
FIG. 6 is an exploded view of the diplexer 10.
Figure 7:
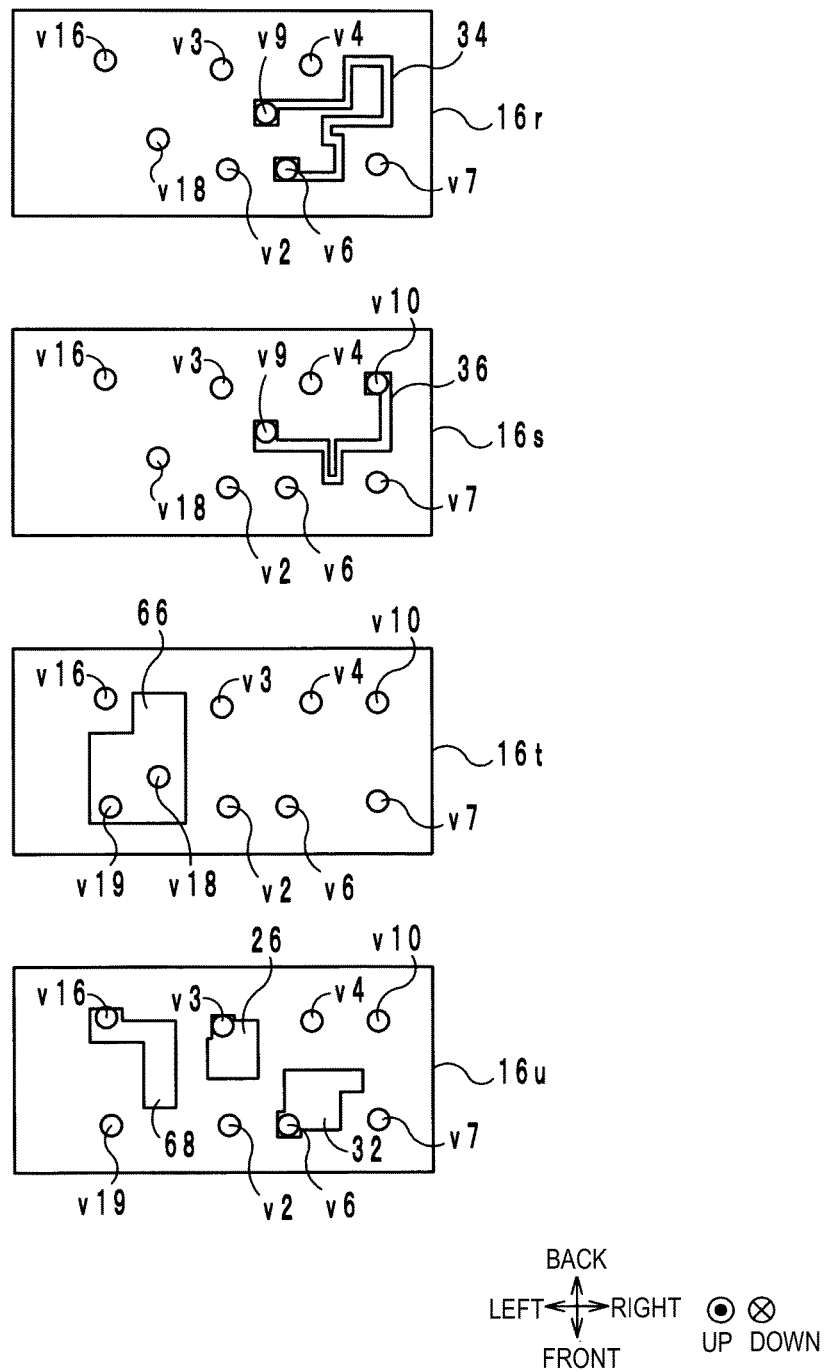
FIG. 7 is an exploded view of the diplexer 10.
Figure 8:
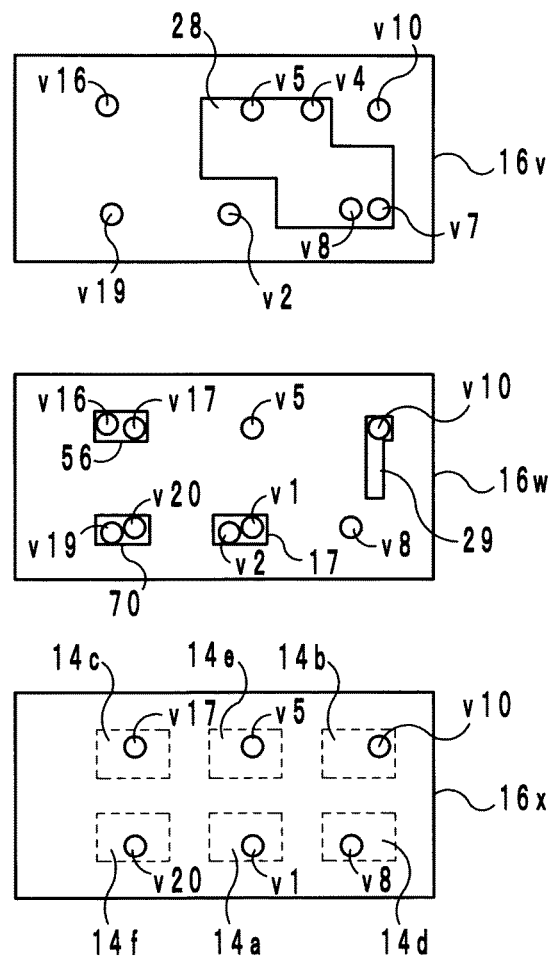
FIG. 8 is an exploded view of the diplexer 10.

Next, a specific configuration of the diplexer 10 will be described while referring to the drawings. FIG. 2A is an external perspective view of the diplexer 10. FIG. 2B is a see-through view of the diplexer 10. FIGS. 3 to 8 are exploded views of the diplexer 10. In the diplexer 10, a stacking direction of a multilayer body 12 is defined as an up-down direction. In addition, when the diplexer 10 is viewed from above, a direction in which long edges of the top surface of the diplexer 10 extend is defined as a left-right direction, and a direction in which short edges of the top surface of the diplexer 10 extend is defined as a front-back direction.

When viewed from above, the LB-side filter LB is provided adjacent to the left side of the HB-side filter HB in the diplexer 10, as illustrated in FIGS. 2A to 8. As illustrated in FIGS. 2A to 8, the diplexer 10 includes the multilayer body 12, the outer electrodes 14a to 14f, connection conductor layers 17, 22a, 22b, 56 and 70, capacitor conductor layers 18a, 18b, 20a, 20b, 26, 28, 29, 30a, 30b, 32, 40, 42a, 42b, 58, 60, 62, 66 and 68, inductor conductor layers 24a to 24c, 34, 36, 38a to 38c, 44a, 44b, 46, 48a, 48b, 50a, 50b, 52, 54a, 54b and 64, and via hole conductors v1 to v22, as a specific configuration.

As illustrated in FIG. 2A, the multilayer body 12 has a rectangular or substantially rectangular parallelepiped shape, and is formed preferably by stacking on top of one another insulator layers 16a to 16x (example of plurality of insulator layers) in this order from the upper side to the lower side. The bottom surface of the multilayer body 12 is a surface that is located on the lower side of the multilayer body 12, and is a mounting surface that faces a circuit substrate when the diplexer 10 is mounted on a circuit substrate.

When viewed from above, the insulator layers 16a to 16x have a rectangular or substantially rectangular shape having long edges that extend in the left-right direction, and are fabricated using a ceramic, for example. Hereafter, the top surfaces of the insulator layers 16a to 16x will be referred to as front surfaces and the bottom surfaces of the insulator layers 16a to 16x will be referred to as rear surfaces.

The outer electrodes 14a to 14f are provided on the bottom surface of the multilayer body 12 and are not provided on the front surface, the back surface, the right surface or the left surface of the multilayer body 12. The outer electrodes 14a to 14f have a rectangular or substantially rectangular shape. The outer electrodes 14d, 14a and 14f are arranged side by side in a single row in this order from the right side to the left side along the front-side long edge of the bottom surface of the multilayer body 12. The outer electrodes 14b, 14e and 14c are arranged side by side in a single row in this order from the right side to the left side along a back-side long edge of the bottom surface of the multilayer body 12. The outer electrodes 14a to 14f are fabricated by applying Ni plating and Sn plating or Ni plating and Au plating onto base electrodes composed of silver or the like, for example.

First, the configurations of elements that are connected to the signal line SL1 will be described. First, the capacitor C5 includes the capacitor conductor layers 18a, 18b, 20a and 20b. In addition, the capacitor conductor layers 20a, 20b, 30a and 30b are included. In more detail, the capacitor conductor layers 18a and 18b are respectively provided near the centers of the front surfaces of the insulator layers 16m and 16o, and each have a rectangular or substantially rectangular shape having long edges that extend in the front-back direction. The capacitor conductor layers 30a and 30b are respectively provided to the right of the capacitor conductor layers 18a and 18b on the front surfaces of the insulator layers 16m and 16o, and each have a rectangular or substantially rectangular shape having long edges that extend in the front-back direction. The capacitor conductor layers 20a and 20b are respectively provided near the centers of the front surfaces of the insulator layers 16n and 16p, and each have a band-like shape that extends in the left-right direction. When viewed in the up-down direction, the left ends of the capacitor conductor layers 20a and 20b are respectively superposed with the capacitor conductor layers 18a and 18b. Thus, the capacitor C5 is provided between the capacitor conductor layers 18a and 18b and the capacitor conductor layers 20a and 20b. When viewed in the up-down direction, the right ends of the capacitor conductor layers 20a and 20b are respectively superposed with the capacitor conductor layers 30a and 30b. Thus, the capacitor C6 is provided between the capacitor conductor layers 30a and 30b and the capacitor conductor layers 20a and 20b. In addition, the capacitor C5 and the capacitor C6 are connected in series with each other via the capacitor conductor layers 20a and 20b.

The capacitor C5 and the outer electrode 14a are connected to each other via the via hole conductors v1 and v2 and the connection conductor layer 17. In more detail, the connection conductor layer 17 is provided near the center of the front-side long edge of the front surface of the insulator layer 16w, and has a rectangular or substantially rectangular shape having long edges that extend in the left-right direction. The via hole conductor v1 penetrates through the insulator layers 16w and 16x in the up-down direction. The lower end of the via hole conductor v1 is connected to the outer electrode 14a. The upper end of the via hole conductor v1 is connected to the right end of the connection conductor layer 17.

The via hole conductor v2 (example of first via hole conductor) penetrates through the insulator layers 16b to 16v, and is superposed with the outer electrode 14a when viewed in the up-down direction. The lower end of the via hole conductor v2 is connected to the left end of the connection conductor layer 17. Therefore, the via hole conductor v2 is electrically connected to the outer electrode 14a via the via hole conductor v1 and the connection conductor layer 17. In addition, the via hole conductor v2 is also connected to the capacitor conductor layers 18a and 18b. Thus, the capacitor C5 and the outer electrode 14a are connected to each other.

The inductor L2 includes the inductor conductor layers 38a to 38c and the via hole conductors v6 and v7. In more detail, the inductor conductor layers 38a to 38c (example of second inductor conductor) are respectively provided near the front-side long edges of the front surfaces of the insulator layers 16b to 16d, and are line-shaped conductor layers that extend in the left-right direction. In this preferred embodiment, the inductor conductor layers 38a to 38c have straight-line shapes that extend from a position that is to the right of the center of the long edge toward the right side. The via hole conductors v6 (example of fourth via hole conductor) penetrate through the insulator layers 16b to 16t in the up-down direction. The upper ends of the via hole conductors v6 are connected to the left ends of the inductor conductor layers 38a to 38c. In other words, the via hole conductors v6 extend from the inductor conductor layers 38a to 38c toward the bottom surface. The via hole conductors v7 (example of fifth via hole conductor) penetrate through the insulator layers 16b to 16u in the up-down direction. The upper ends of the via hole conductors v7 are connected to the right ends of the inductor conductor layers 38a to 38c. In other words, the via hole conductors v7 extend from the inductor conductor layers 38a to 38c toward the bottom surface. In addition, the via hole conductors v6 are positioned to the left of the via hole conductors v7. The via hole conductors v6, v7 and v2 are arranged side by side in a straight line in the left-right direction when viewed from above.

As described above, the inductor L2 is shaped like an upside down square letter U. Furthermore, a rectangular or substantially rectangular plane surrounded and defined by the inductor conductor layers 38a to 38c and the via hole conductors v6 and v7 will be referred to as a second loop plane. The second loop plane has a rectangular or substantially rectangular shape in which a straight line that extends through the centers of the inductor conductor layer 38a in the front-back direction and the center lines of the via hole conductors v6 and v7 define three sides of the rectangular or substantially rectangular shape.

The inductor L1 includes the inductor conductor layers 24a to 24c and the via hole conductors v3 and v4. In more detail, the inductor conductor layers 24a to 24c (example of first inductor conductor) are respectively provided near the back-side long edges of the front surfaces of the insulator layers 16b to 16d, and are line-shaped conductor layers that extend in the left-right direction (rightward direction is example of first direction). In this preferred embodiment, the inductor conductor layers 24a to 24c have straight-line shapes that extend from close to the center of the long edge toward the right side. Therefore, the inductor conductor layers 24a to 24c are respectively parallel or substantially parallel to the inductor conductor layers 38a to 38c, and are respectively positioned to the left of and behind the inductor conductor layers 38a to 38c. In addition, the lengths of the inductor conductor layers 24a to 24c and the lengths of the inductor conductor layers 38a to 38c are equal or substantially equal to each other.

The via hole conductors v3 (example of second via hole conductor) penetrate through the insulator layers 16b to 16t in the up-down direction. The upper ends of the via hole conductors v3 are connected to the left ends of the inductor conductor layers 24a to 24c. In other words, the via hole conductors v3 extend from the inductor conductor layers 24a to 24c toward the bottom surface. Thus, the via hole conductors v3 are positioned to the left of the via hole conductors v6. The via hole conductors v2 and v3 are arranged side by side in a straight line in the front-back direction when viewed from above. The via hole conductors v4 (example of third via hole conductor) penetrate through the insulator layers 16b to 16u in the up-down direction. The upper ends of the via hole conductors v4 are connected to the right ends of the inductor conductor layers 24a to 24c. In other words, the via hole conductors v4 extend from the inductor conductor layers 24a to 24c toward the bottom surface. In addition, the via hole conductors v3 are positioned to the left of the via hole conductors v4. The via hole conductors v3 and v4 are arranged side by side in a straight line in the left-right direction when viewed from above.

As described above, the inductor L1 is shaped like an upside down square letter U. Furthermore, a rectangular or substantially rectangular plane surrounded and defined by the inductor conductor layers 24a to 24c and the via hole conductors v3 and v4 will be referred to as a first loop plane. The first loop plane has a rectangular or substantially rectangular shape in which a straight line that extends through the centers of the inductor conductor layer 24a in the front-back direction and the center lines of the via hole conductors v3 and v4 define three sides of the rectangular shape.

In addition, the inductors L1 and L2 are arranged side by side in the front-back direction, and the inductor L1 positioned behind the inductor L2. Thus, the first loop plane of the inductor L1 faces the second loop plane of the inductor L2. In other words, this means that the two loop planes are superposed with each other when viewed from a prescribed direction. In this preferred embodiment, the first loop plane and the second loop plane are superposed with each other when viewed in the front-back direction. However, the first loop plane protrudes beyond the second loop plane toward the left side, and the second loop plane protrudes beyond the first loop plane toward the right side.

Here, when viewed from above, the center (intersection point of diagonal lines) of the outer electrode 14a (example of input/output terminal) is positioned to the left of the via hole conductors v6 and in front of the via hole conductors v3. Therefore, when viewed in plan from above, the outer electrode 14a is superposed with a space Sp1 that results from the first loop plane protruding beyond the second loop plane toward the left side.

In addition, when viewed from above, the via hole conductor v2 is superposed with the outer electrode 14a. Thus, when viewed from above, the via hole conductor v2 is superposed with the space Sp1, which results from the first loop plane protruding beyond the second loop plane toward the left side. In more detail, the via hole conductor v2 is provided in front of the inductor L1 (in second direction from first loop plane toward second loop plane), and is superposed with the portion of the first loop plane that protrudes beyond the second loop plane when viewed in the front-back direction.

The capacitor C1 includes the capacitor conductor layers and 28. In more detail, the capacitor conductor layer 26 (example of first capacitor conductor) is close to the center of the front surface of the insulator layer 16u, and has a rectangular or substantially rectangular shape. The capacitor conductor layer is connected to the via hole conductors v3. The capacitor conductor layer 28 (example of second capacitor conductor) is provided on the right half of the front surface of the insulator layer 16v, and has a shape obtained by combining two rectangles. The capacitor conductor layer 28 is connected to the lower end of the via hole conductors v4. The capacitor conductor layer 28 faces the capacitor conductor layer 26 with the insulator layer 16u interposed therebetween. Thus, the capacitor C1, which is connected in parallel with the inductor L1, is provided between the capacitor conductor layer 26 and the capacitor conductor layer 28. As a result, the inductor L1 and the capacitor C1 define the LC parallel resonator LC1 (example of first LC parallel resonator).

The capacitor C2 includes the capacitor conductor layers and 32. In more detail, the capacitor conductor layer 32 (example of third capacitor conductor) is provided in front of and to the right of the capacitor conductor layer 26 on the front surface of the insulator layer 16u, and has a rectangular or substantially rectangular shape. The capacitor conductor layer 32 is connected to the lower end of the via hole conductors v6. The capacitor conductor layer 28 (example of fourth capacitor conductor) is connected to the lower end of the via hole conductors v7, and faces the capacitor conductor layer 32 with the insulator layer 16u interposed therebetween. Thus, the capacitor C2, which is connected in parallel with the inductor L2, is provided between the capacitor conductor layer 28 and the capacitor conductor layer 32. As a result, the inductor L2 and the capacitor C2 define the LC parallel resonator LC2 (example of second LC parallel resonator).

One end of the LC parallel resonator LC1 is connected between the capacitor C5 and the capacitor C6 via the connection conductor layers 22a and 22b. In more detail, the connection conductor layers 22a and 22b are respectively provided on the front surfaces of the insulator layers 16n and 16p, and are L-shaped conductor layers. The connection conductor layers 22a and 22b respectively extend from the centers of the capacitor conductor layers 20a and 20b in the left-right direction toward the rear, and then are bent toward the left side. The left ends of the connection conductor layers 22a and 22b are connected to the via hole conductors v3. One end of the LC parallel resonator LC1 is connected between the capacitor C5 and the capacitor C6.

The via hole conductors v6 are connected to the capacitor conductor layers 30a and 30b. Thus, one end of the LC parallel resonator LC2 is connected to the capacitor C6 via the via hole conductors v6.

The other end of the LC parallel resonator LC1 and the other end of the LC parallel resonator LC2 are connected to the outer electrodes 14d and 14e via the via hole conductors v5 and v8. In more detail, the via hole conductors v5 and v8 penetrate through the insulator layers 16v to 16x in the up-down direction. The upper ends of the via hole conductors v5 and v8 are connected to the capacitor conductor layer 28. The lower ends of the via hole conductors v5 and v8 are connected to the outer electrodes 14e and 14d. Thus, the other end of the LC parallel resonator LC1 and the other end of the LC parallel resonator LC2 are connected to the outer electrodes 14d and 14e.

The inductor L5 includes the inductor conductor layers 34 and 36 and the via hole conductor v9. In more detail, the inductor conductor layers 34 and 36 are line-shaped conductor layers that are respectively provided on the right halves of the front surfaces of the insulator layers 16r and 16s, and loop in the counterclockwise direction when viewed from above. The upstream end portion of the inductor conductor layer 34 in the counterclockwise direction is connected to the via hole conductors v6. The downstream end portion of the inductor conductor layer 34 in the counterclockwise direction and the upstream end portion of the inductor conductor layer 36 in the counterclockwise direction are superposed with each other when viewed in the up-down direction. The via hole conductor v9 penetrates through the insulator layer 16r in the up-down direction. The upper end of the via hole conductor v9 is connected to the downstream end portion of the inductor conductor layer 34 in the counterclockwise direction. The lower end of the via hole conductor v9 is connected to the upstream end portion of the inductor conductor layer 36 in the counterclockwise direction. Thus, the inductor conductor layers 34 and 36 and the via hole conductor v9 define the spiral-shaped inductor L5 that advances downward while looping.

The capacitor C7 includes the capacitor conductor layers 28 and 29. In more detail, the capacitor conductor layer 29 is a rectangular or substantially rectangular conductor layer that is provided on the right half of the front surface of the insulator layer 16w. The capacitor conductor layer 29 faces the capacitor conductor layer 28 with the insulator layer 16v interposed therebetween. Thus, the capacitor C7 is provided between the capacitor conductor layer 28 and the capacitor conductor layer 29.

In addition, since the capacitor conductor layer 28 is connected to the outer electrodes 14d and 14e via the via hole conductors v5 and v8, one electrode of the capacitor C7 is connected to the outer electrodes 14d and 14e.

The other electrode of the capacitor C7 is connected to the outer electrode 14b via the via hole conductor v10. The via hole conductor v10 penetrates through the insulator layers 16s to 16x in the up-down direction. The upper end of the via hole conductor v10 is connected to the downstream end portion of the inductor conductor layer 36 in the counterclockwise direction. The lower end of the via hole conductor v10 is connected to the outer electrode 14b. Thus, the inductor L5 is connected to the outer electrode 14b. In addition, the via hole conductor v10 is also connected to the capacitor conductor layer 29. Thus, the other electrode of the capacitor C7 is connected to the outer electrode 14b.

When viewed from above, at least a portion of the LC parallel resonator LC5, which includes the inductor L5 and the capacitor Cp, is superposed with a space Sp2 that results from the second loop plane protruding beyond the first loop plane toward the right side. In more detail, at least a portion of the LC parallel resonator LC5 is provided behind the inductor L2 (in direction opposite to direction from first loop plane toward second loop plane), and is superposed with the portion of the second loop plane that protrudes beyond the first loop plane when viewed in the front-back direction.

Next, the configurations of elements that are connected to the signal line SL2 will be described.

The inductor L3 includes the inductor conductor layers 44a, 44b, 46, 48a and 48b, and the via hole conductors v11 and v12. In more detail, the inductor conductor layers 44a, 44b, 46, 48a and 48b are line-shaped conductor layers that are respectively provided on the left halves of the front surfaces of the insulator layers 16b, 16c, 16e, 16f and 16g. The inductor conductor layers 44a, 44b, 46, 48a and 48b loop in the counterclockwise direction. The upstream end portions of the inductor conductor layers 44a and 44b in the counterclockwise direction are connected to the via hole conductor v2. The downstream end portions of the inductor conductor layers 44a and 44b in the counterclockwise direction and the upstream end portion of the inductor conductor layer 46 in the counterclockwise direction are superposed with each other when viewed in the up-down direction. The via hole conductors v11 penetrate through the insulator layers 16b to 16d in the up-down direction. The upper ends of the via hole conductors v11 are connected to the downstream end portions of the inductor conductor layers 44a and 44b in the counterclockwise direction. The lower end of the via hole conductors v11 is connected to the upstream end portion of the inductor conductor layer 46 in the counterclockwise direction. The downstream end portion of the inductor conductor layer 46 in the counterclockwise direction and the upstream end portions of the inductor conductor layers 48a and 48b in the counterclockwise direction are superposed with each other when viewed in the up-down direction. The via hole conductors v12 penetrate through the insulator layers 16e and 16f in the up-down direction. The upper end of the via hole conductors v12 is connected to the downstream end portion of the inductor conductor layer 46 in the counterclockwise direction. The lower ends of the via hole conductors v12 are connected to the upstream end portions of the inductor conductor layers 48a and 48b in the counterclockwise direction. Thus, the inductor L3 (example of spiral inductor) has a spiral shape that advances downward while looping in the counterclockwise direction when viewed from above, and has an end portion that is positioned on the top surface side (example of first end portion) and an end portion that is positioned on the bottom surface side (example of second end portion). The via hole conductor v2 is connected to the upper end portion of the inductor L3.

The inductor L4 includes the inductor conductor layers 50a, 50b, 52, 54a and 54b, and the via hole conductors v14 and v15. In more detail, the inductor conductor layers 50a, 50b, 52, 54a and 54b are line-shaped conductor layers that are respectively provided on the left halves of the front surfaces of the insulator layers 16f, 16g, 16e, 16b and 16c. The inductor conductor layers 50a, 50b, 52, 54a and 54b loop in the clockwise direction. The upstream end portions of the inductor conductor layers 50a and 50b in the clockwise direction are respectively connected to the downstream end portions of the inductor conductor layers 48a and 48b in the counterclockwise direction. The downstream end portions of the inductor conductor layers 50a and 50b in the clockwise direction and the upstream end portion of the inductor conductor layer 52 in the clockwise direction are superposed with each other when viewed in the up-down direction. The via hole conductors v14 penetrate through the insulator layers 16e and 16f in the up-down direction. The lower ends of the via hole conductors v14 are connected to the downstream end portions of the inductor conductor layers 50a and 50b in the clockwise direction. The upper end of the via hole conductors v14 is connected to the upstream end portion of the inductor conductor layer 52 in the clockwise direction. The downstream end portion of the inductor conductor layer 52 in the clockwise direction and the upstream end portions of the inductor conductor layers 54a and 54b in the clockwise direction are superposed with each other when viewed in the up-down direction. The via hole conductors v15 penetrate through the insulator layers 16b to 16d in the up-down direction. The lower end of the via hole conductors v15 is connected to the downstream end portion of the inductor conductor layer 52 in the clockwise direction. The upper ends of the via hole conductors v15 are connected to the upstream end portions of the inductor conductor layers 54a and 54b in the clockwise direction. Thus, the inductor L4 has a spiral shape that advances downward while looping in the clockwise direction when viewed from above.

The capacitor C3 includes the capacitor conductor layers 40 and 42a. In more detail, the capacitor conductor layer 40 is an L-shaped conductor layer that is provided on the left half of the front surface of the insulator layer 16h. The capacitor conductor layer 42a is a rectangular or substantially rectangular conductor layer that is provided on the left half of the front surface of the insulator layer 16i. The capacitor conductor layer 40 and the capacitor conductor layer 42a face each other with the insulator layer 16h interposed therebetween. Thus, the capacitor C3 (example of third capacitor) is provided between the capacitor conductor layer 40 and the capacitor conductor layer 42a. The capacitor C3 is provided below the inductor L3 (that is, close to the bottom surface).

The capacitor C3 is connected in parallel with the inductor L3 via the via hole conductors v2 and v13. The right end of the capacitor conductor layer 40 is connected to the via hole conductor v2. The via hole conductors v13 penetrate through the insulator layers 16f to 16h in the up-down direction. The upper ends of the via hole conductors v13 are connected to the downstream ends of the inductor conductor layers 48a and 48b in the counterclockwise direction, and to the upstream ends of the inductor conductor layers 50a and 50b in the clockwise direction. Thus, the capacitor C3 is connected in parallel with the inductor L3. The inductor L3 and the capacitor C3 define the LC parallel resonator LC3 (example of third LC parallel resonator).

The capacitor C4 includes the capacitor conductor layers 58, 42a and 42b. In more detail, the capacitor conductor layer 58 is a rectangular or substantially rectangular conductor layer that is provided on the left half of the front surface of the insulator layer 16j. The capacitor conductor layer 42a is a rectangular or substantially rectangular conductor layer that is provided on the left half of the front surface of the insulator layer 16i. The capacitor conductor layer 42b is a rectangular or substantially rectangular conductor layer that is provided on the left half of the front surface of the insulator layer 16k. The capacitor conductor layer 58 and the capacitor conductor layers 42a and 42b face each other with the insulator layers 16i and 16j interposed therebetween. Thus, the capacitor C4 is provided between the capacitor conductor layer 58 and the capacitor conductor layers 42a and 42b. The capacitor C4 is provided below the inductor L4.

The capacitor C4 is connected in parallel with the inductor L4 via the via hole conductors v13 and v16. The via hole conductors v16 penetrate through the insulator layers 16b to 16v in the up-down direction. The upper ends of the via hole conductors v16 are connected to the downstream end portions of the inductor conductor layers 54a and 54b in the clockwise direction. In addition, the via hole conductors v16 are connected to the capacitor conductor layer 58. The upper ends of the via hole conductors v13 are connected to the upstream end portions of the inductor conductor layers 50a and 50b in the clockwise direction. In addition, the lower end of the via hole conductors v13 is connected to the capacitor conductor layer 42a. Thus, the capacitor C4 is connected in parallel with the inductor L4. Therefore, the inductor L4 and the capacitor C4 define the LC parallel resonator LC4.

The LC parallel resonator LC4 is connected to the outer electrode 14c via the via hole conductors v16 and v17 and the connection conductor layer 56. In more detail, the connection conductor layer 56 is provided near the back-side long edge of the front surface of the insulator layer 16w, and has a rectangular or substantially rectangular shape having long edges that extend in the left-right direction. The lower end of the via hole conductors v16 is connected to the left end of the connection conductor layer 56. The via hole conductor v17 penetrates through the insulator layers 16w and 16x in the up-down direction. The upper end of the via hole conductor v17 is connected to the right end of the connection conductor layer 56. The lower end of the via hole conductor v17 is connected to the outer electrode 14c. Thus, the LC parallel resonator LC4 is connected to the outer electrode 14c.

The capacitor C8 includes the capacitor conductor layers 42b, 60 and 62. In more detail, the capacitor conductor layers 60 and 62 are conductor layers that are provided on the left halves of the front surfaces of the insulator layers 16l and 16m. The capacitor conductor layer 60 and the capacitor conductor layers 42b and 62 face each other with the insulator layers 16k and 16l interposed therebetween. Thus, the capacitor C8 is provided between the capacitor conductor layer 60 and the capacitor conductor layers 42b and 62.

The inductor L6 includes the inductor conductor layer 64. In more detail, the inductor conductor layer 64 is a line-shaped conductor layer that is provided on the left half of the front surface of the insulator layer 16q and loops in the clockwise direction. Thus, the inductor L6 loops in the clockwise direction.

The capacitor C8 and the inductor L6 are connected in series with each other via the via hole conductor v22. In more detail, the via hole conductor v22 penetrates through the insulator layers 16l to 16p in the up-down direction. The upper end of the via hole conductor v22 is connected to the capacitor conductor layer 60. The lower end of the via hole conductor v22 is connected to the upstream end portion of the inductor conductor layer 64 in the clockwise direction. Thus, the capacitor C8 and the inductor L6 are connected in series with each other and thus define the LC series resonator LC6.

One electrode of the capacitor C8 is connected to the capacitor C4 via the via hole conductor v21. The via hole conductor v21 penetrates through the insulator layers 16i to 16l in the up-down direction. The upper end of the via hole conductor v21 is connected to the capacitor conductor layer 42a. In addition, the lower end of the via hole conductor v21 is connected to the capacitor conductor layer 62. Furthermore, the via hole conductor v21 is also connected to the capacitor conductor layer 42b. Thus, one electrode of the capacitor C8 is connected to the capacitor C4.

The inductor L6 is connected to the outer electrode 14f via the via hole conductors v18 to v20, the capacitor conductor layer 66 and the connection conductor layer 70. In more detail, the capacitor conductor layer 66 is a rectangular or substantially rectangular conductor layer that is provided on the left half of the insulator layer 16t. The via hole conductor v18 penetrates through the insulator layers 16q to 16s in the up-down direction. The upper end of the via hole conductor v18 is connected to the downstream end portion of the inductor conductor layer 64 in the clockwise direction. The lower end of the via hole conductor v18 is connected to the capacitor conductor layer 66.

In more detail, the connection conductor layer 70 is provided near the front-side long edge of the front surface of the insulator layer 16w, and has a rectangular or substantially rectangular shape having long edges that extend in the left-right direction. The via hole conductor v19 penetrates through the insulator layers 16t to 16v in the up-down direction. The upper end of the via hole conductor v19 is connected to the capacitor conductor layer 66. The lower end of the via hole conductor v19 is connected to the left end of the connection conductor layer 70. The via hole conductor v20 penetrates through the insulator layers 16w and 16x in the up-down direction. The upper end of the via hole conductor v20 is connected to the right end of the connection conductor layer 70. The lower end of the via hole conductor v20 is connected to the outer electrode 14f. Thus, the inductor L6 is connected to the outer electrode 14f.

The capacitor C9 includes the capacitor conductor layers 66 and 68. In more detail, the capacitor conductor layer 68 is a conductor layer that is provided on the left half of the front surface of the insulator layer 16u. The capacitor conductor layer 68 faces the capacitor conductor layer 66 with the insulator layer 16t interposed therebetween. Thus, the capacitor C9 is provided between the capacitor conductor layer 66 and the capacitor conductor layer 68.

The capacitor conductor layer 66 is connected to the outer electrode 14f via the via hole conductors v19 and v20 and the connection conductor layer 70. Therefore, one electrode of the capacitor C9 is connected to the outer electrode 14f.

The capacitor conductor layer 68 is connected to the via hole conductors v16. Therefore, the capacitor conductor layer 68 is connected to the outer electrode 14c via the via hole conductors v16 and v17 and the connection conductor layer 56. Therefore, the other electrode of the capacitor C9 is connected to the outer electrode 14c.

The diplexer 10 significantly reduces or prevents a situation in which routing of conductors becomes complex. In more detail, when the diplexer 10 is progressively reduced in size, there is a risk that the inductor L1 and the inductor L2 will become too close to each other and electromagnetically couple too strongly with each other. Consequently, it is preferable that the electromagnetic field coupling between the inductor L1 and the inductor L2 be weakened by spacing the inductor L1 and the inductor L2 apart from each other in the left-right direction as in the diplexer 10. In this case, by shifting the inductor L2 toward the right side relative to the inductor L1, the space Sp1 is provided that is to the left of the via hole conductors v6 and in front of the via hole conductors v3. Consequently, when viewed from above, the via hole conductor v2 is positioned to the left of the via hole conductors v6 and in front of the via hole conductors v3, and as a result, is superposed with the space Sp1. In other words, the via hole conductor v2, which electrically connects the outer electrode 14a, the HB-side filter HB and the LB-side filter LB to each other, is arranged in the space Sp1, which is provided by shifting the inductor L1 and the inductor L2 relative to each other. Therefore, in the diplexer 10, there is no need to route the conductors that define the HB-side filter HB and the LB-side filter LB so that the conductors avoid the via hole conductor v2. In this way, the diplexer 10 is able to significantly reduce or prevent a situation in which routing of conductors becomes complex.

Furthermore, the diplexer 10 significantly reduces or prevents a situation in which routing of conductors becomes complex while also significantly reducing or preventing an adverse effect of noise. In more detail, the capacitor C3 is provided below the inductor L3. As a result, when the diplexer 10 is mounted on a circuit substrate, the capacitor C3 is positioned between the inductor L3 and the circuit substrate. Thus, noise radiated from the circuit substrate is blocked by the capacitor conductor layers 40 and 42a of the capacitor C3. As a result, the adverse effect of noise is significantly reduced or prevented.

In addition, in the LB-side filter LB, it is necessary to make the inductance value of the inductor L3 large in order to lower the resonant frequency of the LC parallel resonator LC3. In this case, it is not possible to adopt a loop inductor configuration for the inductor L3 like in the case of the inductors L1 and L2, and a spiral configuration has to be adopted instead. Therefore, the inductor L3 includes an upper end and a lower end. Here, the capacitor C3 is arranged below the inductor L3. Accordingly, the lower end of the inductor L3 is connected to the capacitor C3. Therefore, the upper end of the inductor L3 and the outer electrode 14a need to be electrically connected to each other.

Consequently, by arranging the via hole conductor v2 as in the diplexer 10, the upper end of the inductor L3 and the outer electrode 14a are able to be electrically connected to each other by the via hole conductor v2. Therefore, a situation in which routing of the conductors becomes complex is avoided.

Furthermore, a reduction in device size is able to be realized for the diplexer 10. In more detail, in the diplexer 10, the inductor L2 is shifted toward the right side relative to the inductor L1. Thus, when viewed in the up-down direction, the space Sp2 is located to the right of the via hole conductors v4 and behind the via hole conductors v7. Consequently, in the diplexer 10, a portion of the LC parallel resonator LC5, which includes the inductor L5 and the capacitor C7, is located in the space Sp2. Thus, effective utilization of space in the diplexer 10 is promoted and a reduction in size is achieved for the diplexer 10.

First Modification

Figure 9:
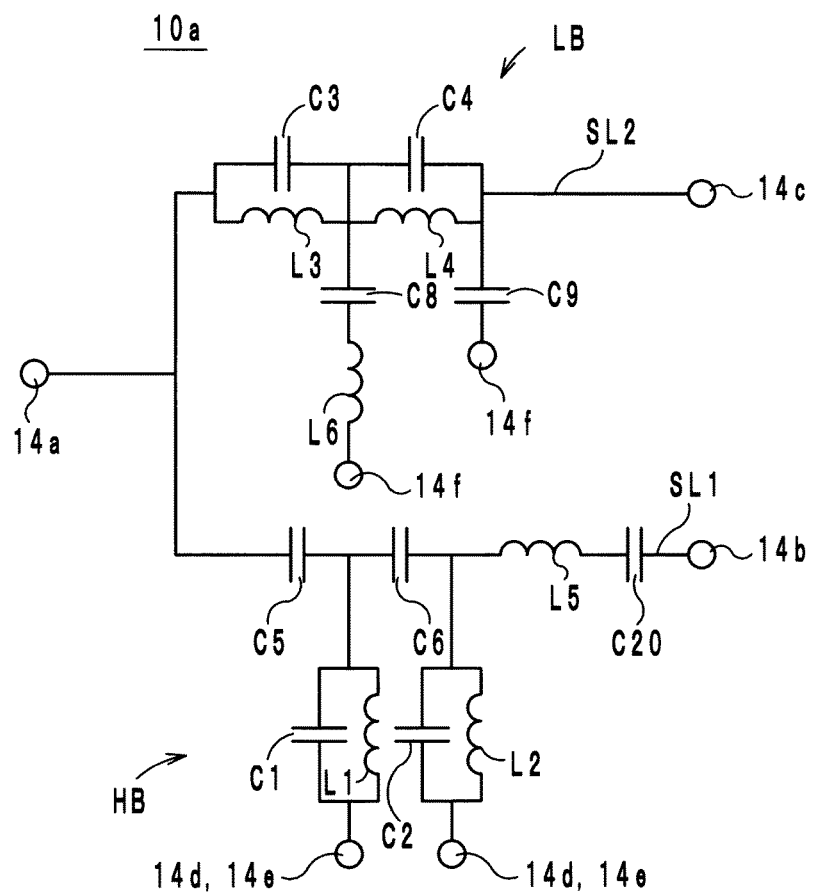
FIG. 9 is an equivalent circuit diagram of a diplexer 10a according to a first modification of a preferred embodiment of the present invention.

Hereafter, a diplexer according to a first modification of a preferred embodiment of the present invention will be described while referring to the drawings. FIG. 9 is an equivalent circuit diagram of a diplexer 10a according to the first modification.

The diplexer 10a differs from the diplexer 10 in that a capacitor C20 is provided in place of the capacitor C7. In more detail, the capacitor C20 is connected between the inductor L5 and the outer electrode 14b. Thus, the capacitor C20 and the inductor L5 define an LC series resonator.

When viewed in the up-down direction, at least a portion of the LC series resonator, which includes the inductor L5 and the capacitor C20, is arranged in the space Sp2 located to the right of the via hole conductors v4 and behind the via hole conductors v7.

The diplexer 10a exhibits the same operational effect as the diplexer 10.

Second Modification

Figure 10:
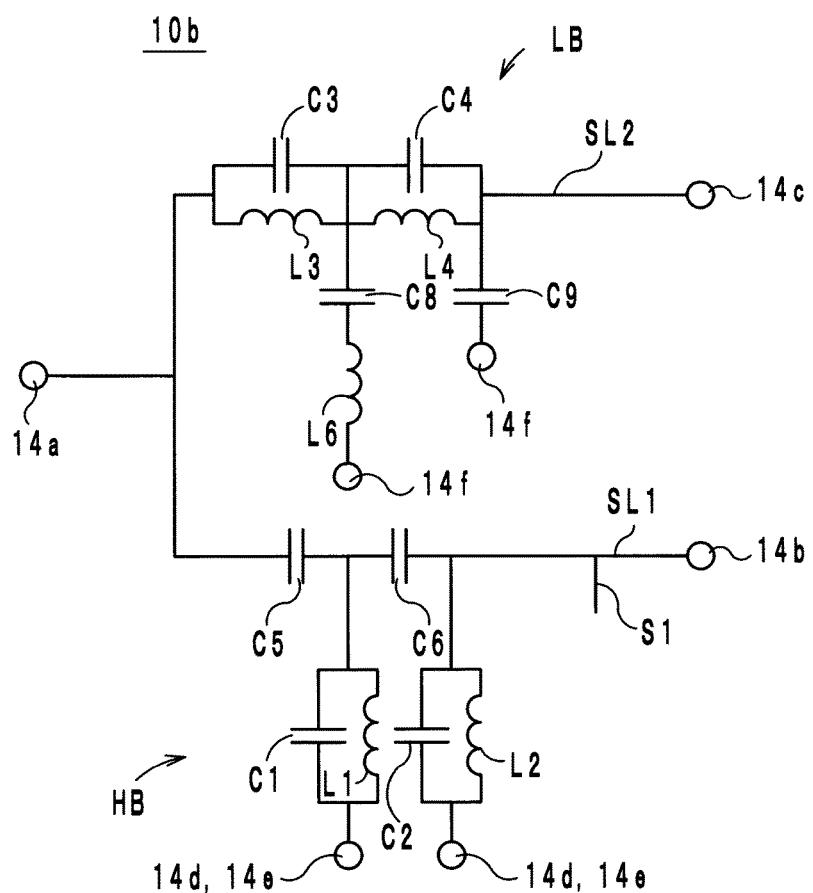
FIG. 10 is an equivalent circuit diagram of a diplexer 10b according to a second modification of a preferred embodiment of the present invention.

Hereafter, a diplexer according to a second modification of a preferred embodiment of the present invention will be described while referring to the drawings. FIG. 10 is an equivalent circuit diagram of a diplexer 10b according to the second modification.

The diplexer 10b differs from the diplexer 10 in that a λ/4 open stub S1 is provided in place of the LC parallel resonator LC5, which includes the inductor L5 and the capacitor C7. In more detail, the λ/4 open stub S1 branches from the signal line SL1 and has a length corresponding to about ¼ the wavelength of a frequency that is desired to be attenuated.

This λ/4 open stub S1 is provided in the space Sp2 that is located to the right of the via hole conductors v4 and behind the via hole conductors v7 when viewed in the up-down direction.

The diplexer 10b exhibits the same operational effect as the diplexer 10.

Third Modification

Figure 11:
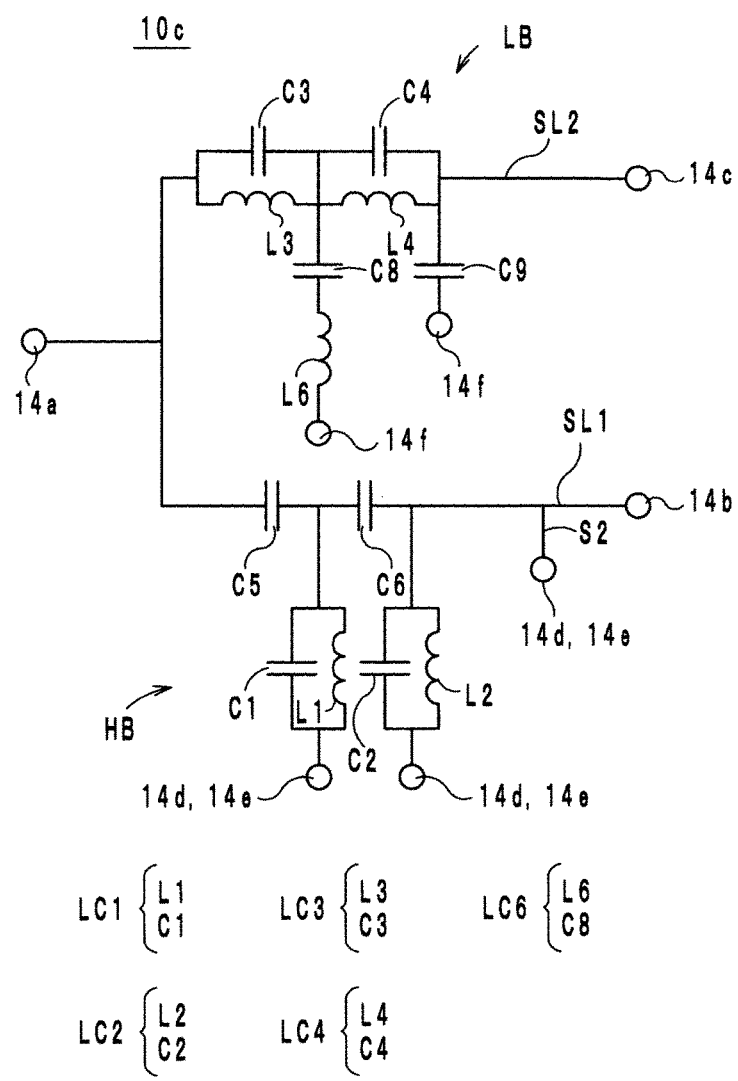
FIG. 11 is an equivalent circuit diagram of a diplexer 10c according to a third modification of a preferred embodiment of the present invention.
Figure 12:
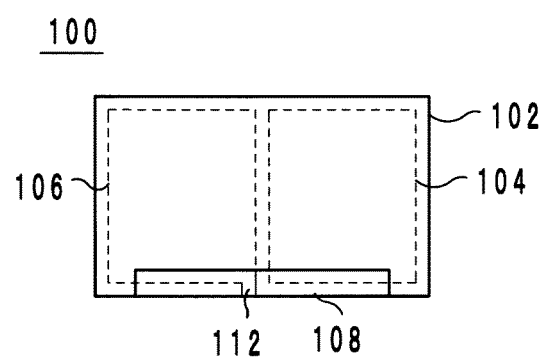
FIG. 12 is a drawing in which a diplexer 100 in which an outer electrode 108 is provided on a side surface of a multilayer body 102 is viewed in a transparent manner from above.
Figure 13:
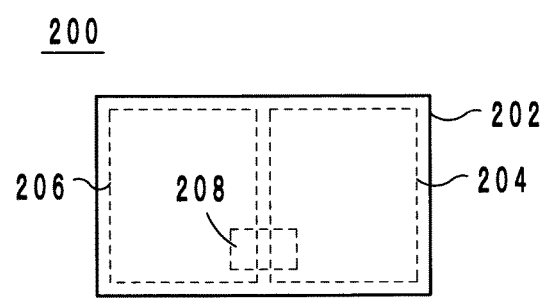
FIG. 13 is a drawing in which a diplexer 200 in which an outer electrode 208 is provided on only a bottom surface of a multilayer body 202 is viewed in a transparent manner from above.

Hereafter, a diplexer according to a third modification of a preferred embodiment of the present invention will be described while referring to the drawings. FIG. 11 is an equivalent circuit diagram of a diplexer 10c according to the third modification.

The diplexer 10c differs from the diplexer 10 in that a λ/4 short stub S2 is provided in place of the LC parallel resonator LC5, which includes the inductor L5 and the capacitor C7. In more detail, the λ/4 short stub S2 branches from the signal line SL1 and has a length corresponding to about ¼ the wavelength of a frequency that is desired to be attenuated. In addition, the leading end of the λ/4 short stub S2 is connected to the outer electrodes 14d and 14e.

This λ/4 short stub S2 is provided in the space Sp2 that is located to the right of the via hole conductors v4 and behind the via hole conductors v7 when viewed in the up-down direction.

The diplexer 10c exhibits the same operational effect as the diplexer 10.

Other Preferred Embodiments

Diplexers according to preferred embodiments of the present invention are not limited to the diplexers 10 and 10a to 10c and can be modified within the scope of the gist of the present invention.

The configurations of the diplexers 10 and 10a to 10c may be combined with each other as appropriate.

In addition, the inductors L3 and L4 do not need to have a spiral shape, and may instead be shaped like a square letter U like the inductors L1 and L2, for example.

Different from the cases illustrated in FIG. 1, FIG. 9, FIG. 10 and FIG. 11, an LC parallel resonator may be connected in series between the outer electrode 14b and the LC parallel resonator LC2.

Furthermore, the first loop plane of the inductor L1 and the second loop plane of the inductor L2 need not be parallel to each other. It is sufficient that the first loop plane and the second loop plane extend in the left-right direction when viewed from above. In addition, the first loop plane and the second loop plane need not be shaped like a straight line when viewed from above.

The via hole conductor v2 may be directly connected to the outer electrode 14a.

As described above, preferred embodiments of the present invention are of use in diplexers, and are particularly excellent in being able to significantly reduce or prevent a situation in which the routing of conductors becomes complex.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A diplexer comprising:
   a multilayer body including a plurality of insulator layers stacked on top of one another in a stacking direction, the multilayer body including a bottom surface at one end in the stacking direction;
   an input/output terminal on the bottom surface;
   a first filter circuit that includes a first loop inductor and a second loop inductor;
   a second filter circuit adjacent to the first filter circuit when viewed in the stacking direction; and
   a first via hole conductor that electrically connects the input/output terminal, the first filter circuit and the second filter circuit to each other; wherein
   the first loop inductor defines a first loop plane and includes:
      a line-shaped first inductor conductor that extends in a first direction from the first filter circuit toward the second filter circuit when viewed in the stacking direction; and
      a second via hole conductor and a third via hole conductor that extend from the first inductor conductor toward the bottom surface;
   the second loop inductor defines a second loop lane and includes:
      a line-shaped second inductor conductor that extends in the first direction when viewed in the stacking direction; and
      a fourth via hole conductor and a fifth via hole conductor that extend from the second inductor conductor toward the bottom surface;
   the first loop plane faces the second loop plane while protruding beyond the second loop plane in the first direction;
   the first via hole conductor is provided in a second direction, which extends from the first loop plane toward the second loop plane, relative to the first loop inductor, and the first via hole conductor is superposed with a portion of the first loop plane that protrudes beyond the second loop plane when viewed in the second direction.

2. The diplexer according to claim 1, wherein
   the second via hole conductor is positioned in the first direction relative to the third via hole conductor;
   the fourth via hole conductor is positioned in the first direction relative to the fifth via hole conductor;
   the first via hole conductor, the fourth via hole conductor and the fifth via hole conductor are arranged side by side along a straight line in the first direction; and
   the first via hole conductor and the second via hole conductor are arranged side by side along a straight line in the second direction.

3. The diplexer according to claim 1, wherein the first filter circuit includes:
   a first LC parallel resonator that includes a first capacitor and the first loop inductor, the first capacitor including a first capacitor conductor that is connected to the second via hole conductor and a second capacitor conductor that is connected to the third via hole conductor and faces the first capacitor conductor; and
   a second LC parallel resonator that includes a second capacitor and the second loop inductor, the second capacitor including a third capacitor conductor that is connected to the fourth via hole conductor and a fourth capacitor conductor that is connected to the fifth via hole conductor and faces the third capacitor conductor.

4. The diplexer according to claim 1, wherein
   the first filter circuit allows a high-frequency signal of a first frequency band to pass therethrough;
   the second filter circuit allows a high-frequency signal of a second frequency band to pass therethrough; and
   a center frequency of the second frequency band is lower than a center frequency of the first frequency band.

5. The diplexer according to claim 1, wherein
   the multilayer body includes a top surface at another end in the stacking direction;
   the second filter circuit includes a third LC parallel resonator that includes a spiral inductor and a third capacitor;
   the spiral inductor has a spiral shape that advances in the stacking direction while looping, and includes a first end portion at a top surface side and a second end portion at a bottom surface side;
   the third capacitor is closer to the bottom surface than the spiral inductor; and
   the first via hole conductor is connected to the first end portion of the spiral inductor.

6. The diplexer according to claim 1, wherein
   the first filter circuit includes an LC resonator;
   the second loop plane protrudes beyond the first loop plane in a direction opposite to the first direction; and
   at least a portion of the LC resonator is provided in a direction opposite to the second direction relative to the second loop inductor, and is superposed with a portion of the second loop plane that protrudes beyond the first loop plane when viewed in the second direction.

7. The diplexer according to claim 1, wherein the first via hole conductor is superposed with the input/output terminal when viewed in the stacking direction.

8. The diplexer according to claim 1, further comprising first and second signal lines that branch from each other.

9. The diplexer according to claim 1, wherein the multilayer body is rectangular or substantially rectangular.

10. The diplexer according to claim 1, wherein at least one of the first loop inductor and the second loop inductor has a shape of an upside down square letter U.

11. The diplexer according to claim 1, wherein at least one of the first loop plane and the second loop plane has a rectangular or substantially rectangular shape.

12. The diplexer according to claim 1, wherein the second via hole conductor is located in a space between the first loop inductor and the second loop inductor.

13. The diplexer according to claim 1, further comprising a capacitor connected between an inductor and an outer electrode.

14. The diplexer according to claim 8, further comprising a $\lambda/4$ open stub that branches from the first signal line.

15. The diplexer according to claim 8, further comprising a $\lambda/4$ short stub that branches from the first signal line.

16. The diplexer according to claim 1, further comprising additional loop inductors that have shapes different from the first loop inductor and the second loop inductor.

17. The diplexer according to claim 1, wherein the first loop plane and the second loop plane are parallel or substantially parallel to each other.

18. The diplexer according to claim 1, wherein the first loop plane and the second loop plane are straight-line shaped when viewed from above.

* * * * *